(12) United States Patent
Wojtczak et al.

(10) Patent No.: US 6,211,126 B1
(45) Date of Patent: Apr. 3, 2001

(54) FORMULATIONS INCLUDING A 1,3-DICARBONYL COMPOUND CHELATING AGENT FOR STRIPPING RESIDUES FROM SEMICONDUCTOR SUBSTRATES

(75) Inventors: William A. Wojtczak; George Guan, both of San Jose, CA (US); Stephen A. Fine, Peabody, MA (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 09/331,537

(22) PCT Filed: Dec. 23, 1997

(86) PCT No.: PCT/US97/23917

§ 371 Date: Apr. 20, 1999

§ 102(e) Date: Apr. 20, 1999

(87) PCT Pub. No.: WO98/28395

PCT Pub. Date: Jul. 2, 1998

(51) Int. Cl.$^7$ .................... C11D 9/04; B08B 6/00; C03C 23/00

(52) U.S. Cl. .................... 510/175; 134/1.1; 134/1; 134/1.2; 134/1.3; 134/2

(58) Field of Search .................... 510/175, 176; 134/1, 1.1, 1.2, 1.3, 2; 156/625.1

(56) References Cited

U.S. PATENT DOCUMENTS

| | | | |
|---|---|---|---|
| 5,290,361 | * 3/1994 | Hayashida et al. | 134/2 |
| 5,840,127 | * 11/1998 | Hayashida et al. | 134/2 |
| 5,885,362 | * 3/1999 | Morinaga et al. | 134/2 |
| 6,030,491 | * 2/2000 | Vaartstra | 156/625.1 |

FOREIGN PATENT DOCUMENTS

| | | | |
|---|---|---|---|
| 0701274A1 | * 3/1996 | (JP) | . |
| WO9822568 | * 5/1998 | (US) | . |
| WO9828395 | * 7/1998 | (US) | . |
| WO60/034144 | * 12/1996 | (WO) | . |

* cited by examiner

*Primary Examiner*—Necholus Ogden
*Assistant Examiner*—Gregory E. Webb
(74) *Attorney, Agent, or Firm*—Oliver A. M. Zitzmann; Robert O. Guillot

(57) ABSTRACT

A semiconductor wafer cleaning formulation for use in post plasma ashing semiconductor fabrication comprising the following components in the percentage by weight ranges shown: an organic amine 2–98%; water 0–50%; a 1,3-dicarbonyl compound chelating agent 0.1–60%; a second or alternative chelating agent 0–25%; a polar organic solvent 2–98%.

22 Claims, No Drawings

FORMULATIONS INCLUDING A 1, 3-DICARBONYL COMPOUND CHELATING AGENT FOR STRIPPING RESIDUES FROM SEMICONDUCTOR SUBSTRATES

CROSS-REFERENCE TO RELATED APPLICATIONS

This application is the U.S. National Phase application to International application No. PCT/US97/23917, which claims priority to U.S. Provisional Application Ser. No. 60/044,826, filed Apr. 25, 1997 and U.S. Provisional Application Ser. No. 60/034,144, filed Dec. 24, 1996.

BACKGROUND OF THE INVENTION

1. Field of the Invention

The present invention relates generally to chemical formulations used in semiconductor wafer fabrication and particularly to chemical formulations that are utilized to remove residue from wafers following a resist plasma ashing step.

2. Description of the Prior Art

The prior art teaches the utilization of various chemical formulations to remove residue and clean wafers following a resist ashing step. Some of these prior art chemical formulations include akaline compositions containing amines and/or tetraalkyl ammonium hydroxides, water and/or other solvents, and chelating agents. The various prior art formulations have drawbacks which include unwanted removal of metal or insulator layers and the corrosion of desirable metal layers, particularly aluminum and aluminum-copper alloys and titanium nitride features. There is therefore a need for chemical formulations which effectively remove residue following a resist ashing step which do not attack and potentially degrade delicate structures which are meant to remain on a wafer.

SUMMARY OF THE INVENTION

A semiconductor wafer cleaning formulation for use in post plasma ashing semiconductor fabrication comprising the following components in the percentage by weight ranges shown:

| | |
|---|---|
| An organic amine | 2–98% |
| Water | 0–50% |
| A 1,3-dicarbonyl compound chelating agent | 0.1–60% |
| A second or alternative chelating agent | 0–25% |
| A polar organic solvent | 2–98% |

It is an advantage of the present invention that it effectively removes inorganic residues following a plasma ashing step.

It is another advantage of the present invention that it effectively removes metal halide and metal oxide residues following plasma ashing.

These and other features and advantages of the present invention will become understood to those of ordinary skill in the art upon review of the following detailed description of the preferred embodiments.

DETAILED DESCRIPTION OF THE PREFERRED EMBODIMENTS

The present invention comprises formulations that are suitable for stripping inorganic wafer residues which originate from high density plasma etching followed by ashing with oxygen-containing plasmas.

The formulations contain 1, 3-dicarbonyl compounds and/or other metal chelating agents, amines, and water or another solvent as primary ingredients.

The preferred formulations utilize the following components (percentages are by weight):

| | |
|---|---|
| An organic amine | 2–98% |
| Water | 0–50% |
| A 1,3-dicarbonyl compound chelating agent | 0.1–60% |
| A second or alternative chelating agent | 0–25% |
| A polar organic solvent | 2–98% |

The preferred amines are:

| | |
|---|---|
| Pentamethyldiethylenetriamine (PMDETA) | 5–95% |
| Triethanolamine (TEA) | 5–95% |

Other amines that are effective are:
Diazabicyclo (2.2.2) octane
Diethylenetriaamine
3,3'-Iminobis (N,N-dimethylpropylamine)
N-Methylimidazole
Tetraethylenepentamine
Triethylenetetramine
Trimethoxyethoxyethylamine
Diethanolamine
Methyldiethanolamine
Tetramethylhexanediamine
N,N-Diethylethanolamine The preferred 1,3-dicarbonyl compound chelating agents are:

| | |
|---|---|
| 2,4-Pentanedione | 2–90% |
| Methyl acetoacetate | 15–70% |
| Dimethylmalonate | 10–48.3% |

Other 1, 3-dicarbonyl compounds which may be utilized are:
N-Methylacetoacetamide
Acetoacetamide
Malonamide The preferred solvents are:

| | |
|---|---|
| Water | 0–50% |
| Ethylene glycol | 0–74% |
| N-Methylpyrrolidone (NMP) | 0–49% |
| Sulfolane | 0–10% |

The preferred secondary or alternative chelating agents that are utilized in some of the formulations are:

| | |
|---|---|
| Ammonium pyrrolidinedithiocarbamate | 0–25% |
| Ammonium carbamate | 0–15% |

-continued

| | |
|---|---|
| Ammonium oxalate | 0–15% |
| Ammonium thiocyanate | 0–15% |
| Ammonium thiosulfate | 0–15% |
| Trifluoroacetic acid | 0–12% |

The utilization of 1,3-dicarbonyl compounds and/or other metal-chelating agents in combination with amines and a solvent are unique features of the invention. These formulations provided better stripping performance and less corrosivity than traditional formulations containing catechol, amine, and solvent.

Examples of the preferred formulations are:

| | |
|---|---|
| PMDETA | 40–55% |
| 2,4-Pentanedione | 15–20% |
| Water | 26.7–45% |
| TEA | 40% |
| 2,4-Pentanedione | 15% |
| Water | 45% |
| PMDETA | 11.7–40% |
| 2,4-Pentanedione | 15–40% |
| Ethylene glycol | 45–48.3% |
| PMDETA | 11.7% |
| 2,4-Pentanedione | 40% |
| NMP | 48.3% |

The inventors expect that other closely related ingredients would be expected to show comparable performance to those utilized in the preferred formulations.

These include:

A. Other tertiary organic amines are expected to be suitable:

B. Other 1,3-dicarbonyl compounds and related compounds are expected to display comparable performance. These would have the following general structure:

X—CHR—Y in which

R is either a Hydrogen atom or an aliphatic group and

X and Y are functional groups containing multiply bonded moities known to have electron-withdrawing properties, for example X and Y may be $CONH_2$ $CONHR'$, CN, $NO_2$, $SOR'$, $SO_2Z$ in which R' represents an alkyl group and Z represents another atom or group. X and Y may be identical or different.

C. Other carbamate salts are expected to function similarly to ammonium carbamate.

D. Other dialkyldithiocarbamates are expected to function similarly to ammonium pyrrolidinedithiocarbamate.

E. Other polar organic solvents are expected to be suitable either alone or when mixed with water.

F. It would also be expected that inclusion of optional components such as surfactants, stabilizers, corrosion inhibitors, buffering agents, and cosolvents would constitute obvious additions to those practiced in the art.

The formulations of the present invention are particularly useful on wafers which have been etched with chlorine- or fluorine-containing plasmas followed by oxygen plasma ashing. The residues generated by this type of processing typically contain inorganic materials such as, but not limited to aluminum oxide and titanium oxide. These residues are often difficult to dissolve completely without causing corrosion of metal and titanium nitride features required for effective device performance.

Four types of commercially generated wafers containing vias and metal lines were evaluated using the formulations of the present invention. In each case, following plasma etching and ashing the residue was removed from the wafer by immersion of the wafer in a formulation bath at 60° C. for 30 minutes followed by washing with deionized water and drying with a stream of nitrogen gas. It is expected by the inventors that the formulations can also be applied by spraying onto the wafers in an automated spray tool followed by a water rinse.

The four via and line structures were:

1. 0.8 micron diameter, four layer vias comprised of silicon oxide top and second layers, a third layer of titanium nitride, and a bottom layer of aluminum, silicon, copper (AlSiCu) alloy. The substrate was silicon oxide.

2. One micron diameter, two-layer vias comprised of a top layer of silicon oxide (7000 Angs. thick) and a middle layer of titanium nitride (1200 Angs. thick) on top of a silicon substrate.

3. 1.2 micron wide, 4-layer metal lines with a top layer of Titanium/Tungsten (6000 Angs. thick), a third layer of Titanium/Tungsten (1200 Angs thick), and a bottom layer of Titanium (500 Angs. thick) on a silicon oxide substrate.

4. Two microns wide, 3-layer metal lines with a top layer of Titanium (200 Angs. thick), a middle layer of Aluminum/Silicon/Copper (750 Angs. thick), and a bottom layer of Titanium/Tungsten (1250 Angs. thick) on a silicon oxide substrate.

The present invention formulations were rated for relative stripping effectiveness and corrosivity. The preferred formulations scored best and, in overall performance based on both stripping effectiveness and low corrosivity, are approximately equal.

While the present invention has been described with reference to certain preferred embodiments, it will be understood by those skilled in the art that various alterations and modifications may be made therein without departing from the true spirit and scope of the invention. It is therefore intended that the following claims cover all such alterations and modifications which nevertheless include the true spirit and scope of the invention.

What I claim is:

1. A semiconductor wafer cleaning formulation for use in post plasma ashing semiconductor fabrication comprising the following components in the percentage by weight ranges shown:

| | |
|---|---|
| An organic amine | 2–98% |
| Water | 0–50% |
| A 1,3-dicarbonyl compound chelating agent | 0.1–60% |
| A second or alternative chelating agent | 0–25% |
| A polar organic solvent | 2–98% |

2. A cleaning formulation as described in claim 1 wherein said organic amine is chosen from the group consisting of:

| | |
|---|---|
| Pentamethyldiethylenetriamine (PMDETA) | 5–95% |
| Triethanolamine (TEA) | 5–95%. |

3. A cleaning formulation as described in claim 1 wherein said 1,3-dicarbonyl compound chelating agent is chosen from the group consisting of:

| | |
|---|---|
| 2,4-Pentanedione | 2–90% |
| Methyl acetoacetate | 15–70% |
| Dimethylmalonate | 10–48.3%. |

4. A cleaning formulation as described in claim 1 wherein said polar organic solvent is chosen from the group consisting of:

| | |
|---|---|
| Ethylene glycol | 0–74% |
| N-Methylpyrrolodone (NMP) | 0–49% |
| Sulfolane | 0–10%. |

5. A cleaning formulation as described in claim 1 wherein said secondary or alternative chelating agent is chosen from the group consisting of:

| | |
|---|---|
| Ammonium pyrrolidinedithiocarbamate | 0–25% |
| Ammonium carbamate | 0–15% |
| Ammonium oxalate | 0–15% |
| Ammonium thiocyanate | 0–15% |
| Ammonium thiosulfate | 0–15% |
| Trifluoroacetic acid | 0–12% |

6. A cleaning formulation as described in claim 1 wherein said organic amine is chosen from the group consisting of:

Pentamethyldiethylenetriamine (PMDETA)

Triethanolamine (TEA)

Diazabicyclo (2.2.2) octane

Diethylenetriamine 3,3'-Iminobis (N,N-dimethylpropylamine)

N-Methylimidazole

Tetraethylenepentamine

Triethylenetetramine

Trimethoxyethoxyethylamine

Diethanolamine

Methyldiethanolamine

Tetramethylhexanediamine

N,N-Diethylethanolamine.

7. A cleaning formulation as described in claim 1 wherein said 1,3-dicarbonyl compound chelating agent is chosen from the group consisting of:

2,4-Pentanedione

Methyl acetoacetate

Dimethylmalonate

N-Methylacetoacetamide

Acetoacetamide

Malonamide.

8. A cleaning formulation as described in claim 1 wherein said organic amine is chosen from the group consisting of:

| | |
|---|---|
| Pentamethyldiethylenetriamine (PMDETA) | 5–95% |
| Triethanolamine (TEA) | 5–95% | said 1,3-dicarbonyl compound chelating agent is chosen from the group consisting of:

| | |
|---|---|
| 2,4-Pentanedione | 2–90% |
| Methyl acetoacetate | 15–70% |
| Dimethylmalonate | 10–48.3% | and said polar organic solvent is chosen from the group consisting of:

| | |
|---|---|
| Ethylene glycol | 0–74% |
| N-Methylpyrrolodone (NMP) | 0–49% |
| Sulfolane | 0–10%. |

9. A cleaning formulation as described in claim 1 wherein said chelating agent would have the following general structure:

X—CHR—Y in which

R is either a hydrogen atom or an aliphatic group and X and Y are functional groups containing multiply bonded moities known to have electron-withdrawing properties, wherein X and Y may be $CONH_2$, CONHR', CN, $NO_2$, SOR', $SO_2Z$ in which R' represents an alkyl group, and Z represents another atom or group. and wherein X and Y may be identical or different.

10. A cleaning formulation as described in claim 1 being comprised of:

| | |
|---|---|
| PMDETA | 40–55% |
| 2,4-Pentanedione | 15–20% |
| Water | 26.7–45%. |

11. A cleaning formulation as described in claim 1 being comprised of:

| | |
|---|---|
| TEA | 40% |
| 2,4-Pentanedione | 15% |
| Water | 45%. |

12. A cleaning formulation as described in claim 1 being comprised of:

| | |
|---|---|
| PMDETA | 11.7–40% |
| 2,4-Pentanedione | 15–40% |
| Ethylene glycol | 45–48.3%. |

13. A cleaning formulation as described in claim 1 being comprised of:

| | |
|---|---|
| PMDETA | 11.7% |
| 2,4-Pentanedione | 40% |
| NMP | 48.3%. |

14. A method for fabricating a semiconductor wafer including the steps comprising:

plasma etching a metalized layer from a surface of the wafer;

plasma ashing a resist from the surface of the wafer following the metal etching step;

cleaning the wafer in the following step using a chemical formulation including the following components in the percentage by weight ranges shown:

| | |
|---|---|
| An organic amine | 2–98% |
| Water | 0–50% |
| A 1,3-dicarbonyl compound chelating agent | 0.1–60% |
| A second or alternative chelating agent | 0–25% |
| A polar organic solvent | 2–98% |

15. A method as described in claim 14 wherein said organic amine is chosen from the group consisting of:

| | |
|---|---|
| Pentamethyldiethylenetriamine (PMDETA) | 5–95% |
| Triethanolamine (TEA) | 5–95%. |

16. A method as described in claim 14 wherein said 1,3-dicarbonyl compound chelating agent is chosen from the group consisting of:

| | |
|---|---|
| 2,4-Pentanedione | 2–90% |
| Methyl acetoacetate | 15–70% |
| Dimethylmalonate | 10–48.3%. |

17. A method as described in claim 14 wherein said polar organic solvent is chosen from the group consisting of:

| | |
|---|---|
| Ethylene glycol | 0–74% |
| N-Methylpyrrolodone (NMP) | 0–49% |
| Sulfolane | 0–10%. |

18. A method as described in claim 14 wherein said second or alternative chelating agent is chosen from the group consisting of:

| | |
|---|---|
| Ammonium pyrrolidinedithiocarbamate | 0–25% |
| Ammonium carbamate | 0–15% |
| Ammonium oxalate | 0–15% |
| Ammonium thiocyanate | 0–15% |
| Ammonium thiosulfate | 0–15% |
| Trifluoroacetic acid | 0–12%. |

19. A method as described in claim 14 wherein said organic amine is chosen from the group consisting of:
Pentamethyldiethylenetriamine (PMDETA)
Triethanolamine (TEA)
Diazabicyclo (2.2.2) octane
Diethylenetriamine
3,3'-Iminobis (N,N-dimethylpropylamine)
N-Methylimidazole
Tetraethylenepentamine
Triethylenetetramine
Trimethoxyethoxyethylamine
Diethanolamine
Methyldiethanolamine
Tetramethylhexanediamine
N,N-Diethylethanolamine.

20. A method as described in claim 14 wherein said 1,3-dicarbonyl compound chelating agent is chosen from the group consisting of:
2,4-Pentanedione
Methyl acetoacetate
Dimethylmalonate
N-Methylacetoacetamide
Acetoacetamide
Malonamide.

21. A method as described in claim 14 wherein said organic amine is chosen from the group consisting of:

| | |
|---|---|
| Pentamethyldiethylenetriamine (PMDETA) | 5–95% |
| Triethanolamine (TEA) | 5–95%. | said 1,3-dicarbonyl compound chelating agent is chosen from the group consisting of:

| | |
|---|---|
| 2,4-Pentanedione | 2–90% |
| Methyl acetoacetate | 15–70% |
| Dimethylmalonate | 10–48.3% | and said polar organic solvent is chosen from the group consisting of:

| | |
|---|---|
| Ethylene glycol | 0–74% |
| N-Methylpyrrolodone (NMP) | 0–49% |
| Sulfolane | 0–10%. |

22. A method as described in claim 14 wherein said chelating agent would have the following general structure:
X—CHR—Y in which
R is either a hydrogen atom or an aliphatic group and
X and Y are functional groups containing multiply bonded moities known to have electron-withdrawing properties, wherein X and Y may be $CONH_2$, $CONHR'$, $CN$, $NO_2$, $SOR'$, $SO_2Z$ in which R' represents an alkyl group and Z represents another atom or group and wherein X and Y may be identical or different.

* * * * *